United States Patent [19]

Hale

[11] Patent Number: 5,642,956

[45] Date of Patent: Jul. 1, 1997

[54] ADJUSTABLE LINK FOR KINEMATIC MOUNTING SYSTEMS

[75] Inventor: Layton C. Hale, Livermore, Calif.

[73] Assignee: Regents of the University of California, Oakland, Calif.

[21] Appl. No.: 590,375

[22] Filed: Jan. 25, 1996

[51] Int. Cl.⁶ .................................................... F16C 11/06
[52] U.S. Cl. .......................... 403/122; 403/131; 403/56
[58] Field of Search .............................. 403/131, 57, 56, 403/24, 122, 128, 141, 142, 143, 144, 76; 74/490.05; 901/28, 29

[56] References Cited

U.S. PATENT DOCUMENTS

| | | | |
|---|---|---|---|
| 1,500,921 | 7/1924 | Bramson et al. | 403/56 X |
| 3,197,552 | 7/1965 | Flair | 403/56 X |
| 4,472,079 | 9/1984 | Langner | 403/56 X |
| 4,652,166 | 3/1987 | Gautron | 403/56 X |
| 4,804,220 | 2/1989 | Rosheim | 901/29 X |
| 4,805,477 | 2/1989 | Akeel | 901/29 X |
| 5,451,134 | 9/1995 | Bryfogle | 74/490.05 X |

FOREIGN PATENT DOCUMENTS 2660714  10/1991  France ............................ 403/56

*Primary Examiner*—Harry C. Kim
*Attorney, Agent, or Firm*—L. E. Carnahan; Henry P. Sartorio

[57] ABSTRACT

An adjustable link for kinematic mounting systems. The adjustable link is a low-cost, passive device that provides backlash-free adjustment along its single constraint direction and flexural freedom in all other directions. The adjustable link comprises two spheres, two sockets in which the spheres are adjustable retain, and a connection link threadly connected at each end to the spheres, to provide a single direction of restraint and to adjust the length or distance between the sockets. Six such adjustable links provide for six degrees of freedom for mounting an instrument on a support. The adjustable link has applications in any machine or instrument requiring precision adjustment in six degrees of freedom, isolation from deformations of the supporting platform, and/or additional structural damping. The damping is accomplished by using a hollow connection link that contains an inner rod and a viscoelastic separation layer between the two.

15 Claims, 2 Drawing Sheets

ADJUSTABLE LINK FOR KINEMATIC MOUNTING SYSTEMS

The United States Government has rights in this invention pursuant to Contract No. W-7405-ENG-48 between the United States Department of Energy and the University of California for the operation of Lawrence Livermore National Laboratory.

BACKGROUND OF THE INVENTION

This invention relates to kinematic mounting systems, particularly to adjustable kinematic mounting systems, and more particularly to an adjustable link and/or damping structure which enables adjustment for six degrees of freedom and structural damping by one to two orders of magnitude.

Kinematic mounting systems have long been known to provide an economical and dependable method for attaining high repeatability and accurate positioning in structures. A kinematic mounting system provides the exact number of constraints (six) required to locate an object in space relative to its supporting platform. Precision machines and instruments are frequently mounted this way so as to be uninfluenced by deformations of the supporting platform. An adjustment to any constraint will move the instrument to a different but predictable location and orientation. The proper combination of adjustments to the six constraints will alter the instrument's position and orientation relative to the supporting platform as desired. This principal is well known and has been used previously on various manipulators.

There has been a need for a readily adjustable kinematic mounting arrangement. The present invention fills this need by providing a low-cost, passive device, which incorporates an adjustable link that provides backlash-free adjustment along its single constraint direction and flexural freedom in all other directions. Six of these devices, properly placed, will provide adjustment for six degrees of freedom and will fully constrain the instrument relative to the support structure. In addition, the adjustable link arrangement may be provided with built-in damping means which will improve structural damping by one to two orders of magnitude. The damping means will reduce amplifications at resonance excited by broad-band vibration sources by the same order of magnitude.

SUMMARY OF THE INVENTION

It is an object of the present invention to provide an adjustable kinematic mounting device.

A further object of the invention is to provide an adjustable kinematic device having a built-in damping means.

A further object of the invention is to provide an adjustable link for kinematic mounting system.

A further object of the invention is to provide an adjustable link and damping mechanism for kinematic mounting systems.

Another object of the invention is to provide a kinematic mounting device which utilizes a pair of spheres and an interconnecting link having threaded ends which are adjustable screwed into or out of said spheres.

Another object of the invention is to provide an adjustable link for a kinematic device which includes a damping arrangement wherein the link is hollow and contains an inner rod and a viscoelastic separation layer there between.

Another object of the invention is to provide a damping structure for a kinematic link mounting device wherein an axial force acting on the link produces shear which dissipates vibrational energy.

Other objects and advantages will become apparent from the following description and accompanying drawings. The invention is an adjustable link for a kinematic mounting device which utilizes a pair of spheres interconnected by an adjustable link having a threaded interconnection with the spheres. The spheres and the ends of the link are threaded so as to provide a different moving action when threaded in to spheres, thus enabling a greater adjustability between the link and spheres. The damping action, known as constrained layer damping, is provided by utilizing a hollow interconnection link between the spheres, which contains an inner rod surrounded by a viscoelastic layer, which dissipates vibrational energy.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The invention is directed to a kinematic mounting device having an adjustable link that provides backlash-free adjustment along its single constraint direction and flexural freedom in all other directions. For supporting an instrument requiring six degrees of freedom, six of the adjustable link devices would be utilized, and when properly placed will provide adjustment for the six degrees of freedom and will fully constrain the instrument relative to the support structure, and thus the instrument is uninfluenced by deformations of the supporting platform. An adjustment to any constraint will move the instrument to a different but predictable location and orientation. Thus, the adjustable link device may be used in applications requiring isolation from deformations of the supporting platform, and/or structural damping using a constrained layer damping construction of the adjustable link. The device, for example, may be used to support an optical system for a phololithography step-and-repeat machine, which requires precision adjustment in six degrees of freedom, isolation from deformations of the supporting platform, and/or structural damping.

The built-in damping arrangement will improve structural damping by one or two orders of magnitude. This will reduce amplifications at resonance excited by broad-band vibration sources by the same order of magnitude.

Basically, the adjustable link device comprises a pair of spheres, two sockets located in a constraint or support member with clamping nuts for retaining the spheres, an interconnecting link threaded at each end, with the threaded ends extending into threaded openings in the spheres. The damping is provided by using a hollow interconnecting link that contains an inner rod and a viscoelastic separation layer there between, whereby an axial force acting on the link produces shear in the viscoelastic layer, which dissipates vibrational energy. The threaded interconnection link provides a single direction of constraint and a means to adjust the length between the sockets. Six suitable combined links bridge the space between an instrument and the supporting platform to form a kinematic mounting system that provides backlash-free adjustment for six degrees of freedom.

Figure 1:
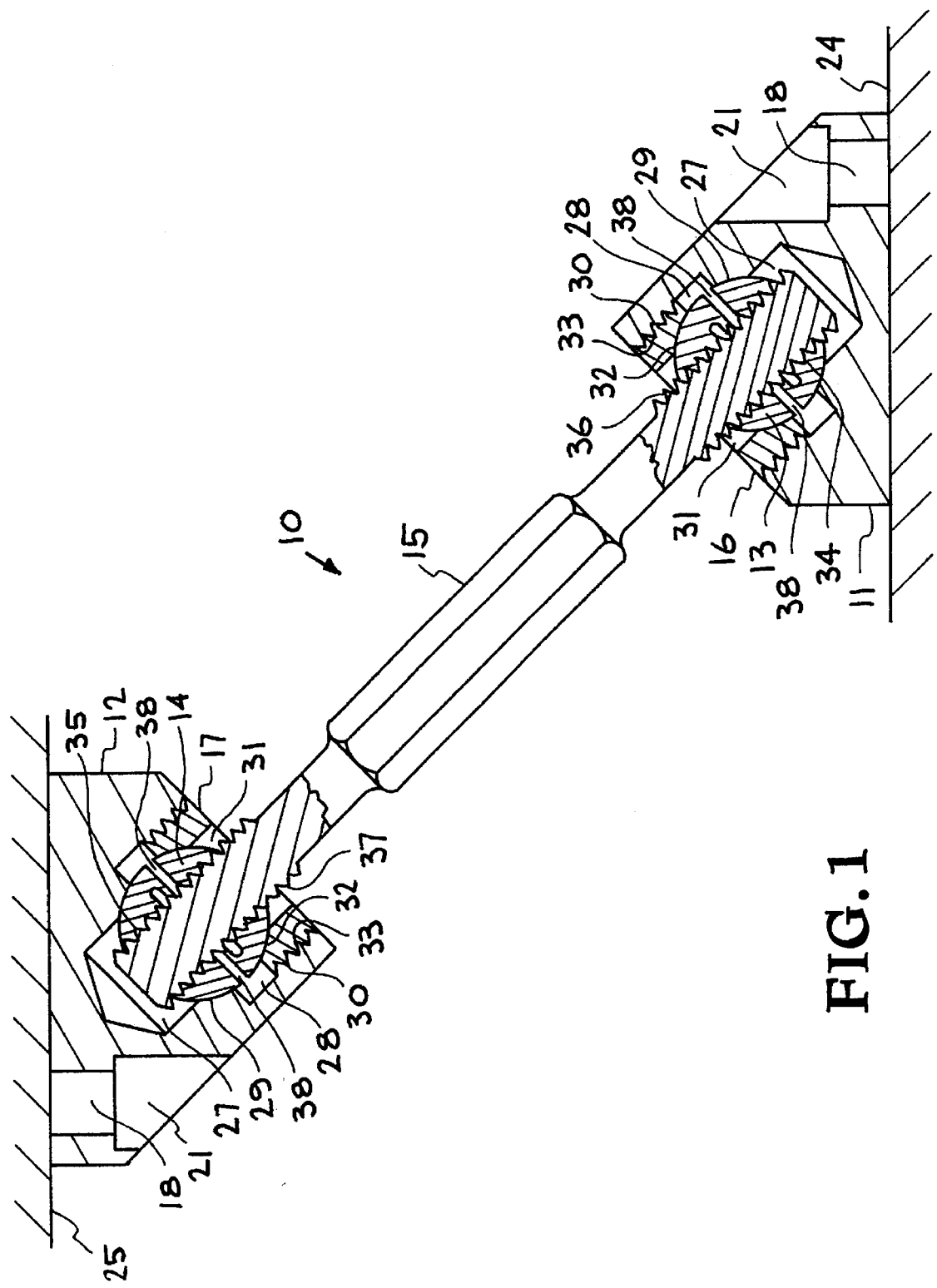
FIG. 1 is a partial cross-sectional view of an embodiment of the adjustable link kinematic mounting device, made in accordance with the invention.

FIG. 1 shows a single adjustable link for a kinematic mounting system. The connection link is threaded on each end to provide adjustment between the two spheres by rotating the link. The threads on each end of the link are necessarily different, and there are two logical arrangements. Having the same lead but opposite hand would afford the greatest range of motion, but the adjustment resolution would be relatively course. Having the same hand but different lead would greatly improve resolution at the expense of range. A combination fine and course adjustment is possible by adding travel stops to the fine thread so that the sphere rotates with the link, thus temporarily ceasing differential action.

Each sphere rests in a gothic arch shaped socket to provide a thin ring of contact. A similarly shaped clamping nut preloads the sphere into the socket and by virtue of the flexural cuts in the spheres also preloads the threads. Adjustments are made prior to tightening all of the clamping nuts on each of the adjustable links so that the spheres are free to pivot and the links are free to rotate. With the damping nuts secured, no backlash exists in the connections, and the flexibility of each link in bending preserves the attributes of the non-influencing mounting system.

Figure 3:
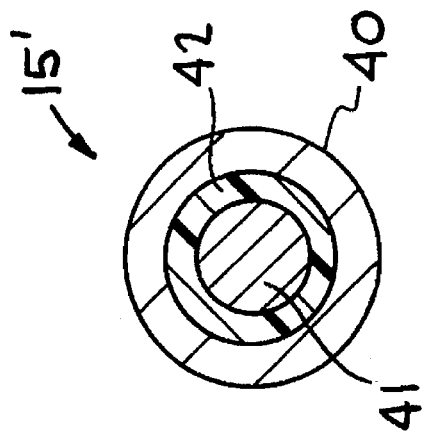
FIG. 3 is an enlarged cross-sectional view of another embodiment of the adjustable link of the FIG. 1 device illustrating the constrained layer damping arrangement.

An optional construction of the link is shown in FIG. 3, which provides a built-in damping arrangement that will improve structural damping by one to two orders of magnitude. This entails using a hollow connection link that contains an inner rod and a viscoelastic separation layer there between. An axial force acting on the link produces shear in the viscoelastic layer, which dissipates vibrational energy, a technique known as constrained layer damping.

While the invention is described for use in a mounting system requiring adjustment in six degrees of freedom and thus utilizing six adjustable link devices, for application which do not require adjustment in six degrees of freedom, a lesser number of the adjustable link devices may be utilized.

Figure 2:
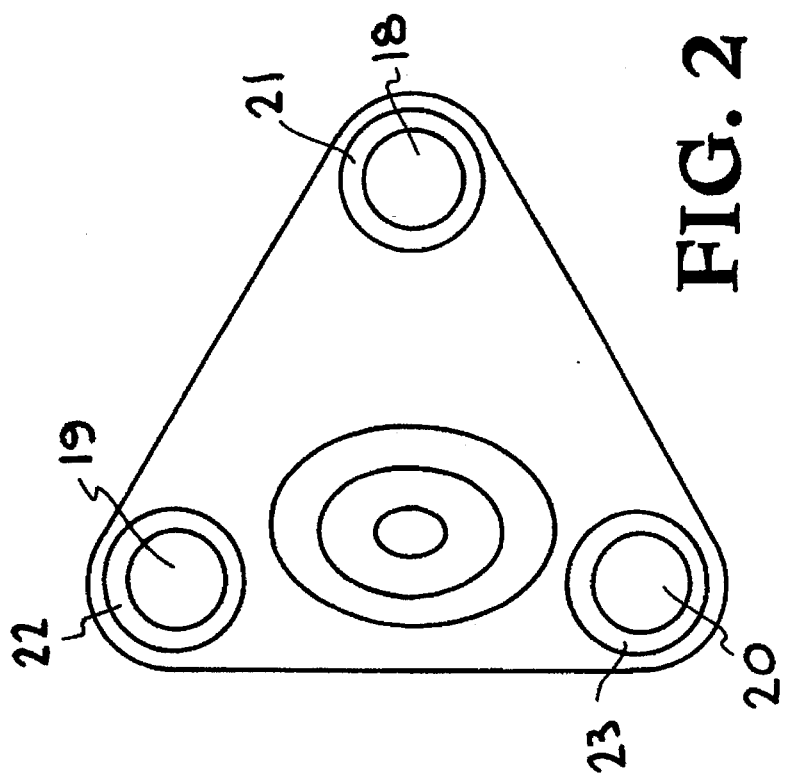
FIG. 2 is a plan view of the sphere constraint and mounting component of the FIG. 1 device.

Referring now to the embodiments illustrated in the drawings, FIGS. 1 and 2 illustrate an embodiment of an adjustable link device for kinematic mounting systems, with FIG. 3 illustrating an embodiment of a constrained layer damping arrangement which may be utilized in the FIG. 1 device. As shown in FIG. 1 the adjustable link device, generally indicated at 10 basically comprises a pair of gothic arch shaped socket support members 11 and 12, a pair of spheres 13 and 14, and interconnecting link 15, and a pair of clamping nuts 16 and 17 which adjustably retain the spheres 13 and 14 in socket support members 11 and 12. As seen in FIGS. 1 and 2 each of the socket support members 11 and 12 is provided with three (3) equally spaced apertures 18, 19, and 20 having an enlarged section 21, 22, and 23 by which members 11 and 12 are secured by bolts, not shown, to a supporting platform 24 and to an instrument 25. Socket support members 11 and 12 each include an opening having different diameter sections 27 and 28 interconnected by a concave section 29, with larger diameter section 28 being threaded at the outer end thereof as indicated at 30. Each of clamping nuts 16 and 17 is provided with a central opening 31, a concave surface 32, and an outer threaded surface 33. Each of spheres 13 and 14 include a central threaded opening 34 and 35, while interconnecting link 15 includes threaded end sections 36 and 37 which are of a different configuration, as pointed out above, and are threaded into similar threaded openings 34 and 35 of spheres 13 and 14.

As shown in FIG. 1, spheres 13 and 14 are retained intermediate concave section 29 of socket support members 11 and 12 and concave surface 32 of clamping nuts 16 and 17 when the clamping nuts are threaded secured in threaded section 30 of member 11 and 12. Adjustment of the link to increase or decrease the distance between socket support members 11 and 12 is accomplished by merely rotating the link 15 such that threaded end sections 36 and 37 move in threaded openings 34 and 35 of spheres 13 and 14. The angle of the link 15 is determined by the lengths of the links. For example, adjusting any link will change the angle of all links. The requirement is that all links be positioned to seek the angle defined by the positions of the sockets. Flexural cuts 38 in each of the spheres 13 and 14 enable preloading of the spheres into the sockets as well as preloading the threads.

FIG. 3 illustrates in cross-section a modified embodiment of the link 15 of FIG. 1 to incorporate therein a constrained layer damping arrangement. The damped link indicated at 15' comprises a hollow member 40 having threaded end sections as in link 15 of FIG. 1, a rod 41 which extends through the length of hollow member 40, and a viscoelastic separation layer 42 between member 40 and rod 41. By way of example, the hollow member 40 may be constructed of hardened steel (300–400 HBn), 303 stainless steel, or 17–4 pH hardened stainless steel, the rod 41 constructed of mild steel; and the viscoelastic layer 42 constructed of compounds such as DYAD 606 manufactured by Soundcoat. The cross-section (diameter/thickness) of each of components 40, 41, and 42, as well as material from which the components are constructed, would depend on the size of the mounting system which would be determined by the size and/or weight of the instrument to be supported.

It has thus been shown that the present invention provides a backlash-free adjustable link device for kinematic mounting systems. The device has applications to any machine or instrument requiring adjustment in up to six degrees of freedom, isolation from deformations of the supporting platform, and/or additional structural damping.

While particular embodiments, materials, etc. have been set forth to exemplify and/or explain the principles of the invention, such are not intended to be limiting. Modifications and changes may become apparent to those skilled in the art, and it is intended that the invention be limited only by the scope of the appended claims.

The invention claimed is:

1. An adjustable link for a kinematic mounting system, comprising:

a pair of internally threaded spheres, a pair of socket support members for retaining said spheres, a pair of adjustable means for retaining said spheres in said socket support members, and a connecting link having threads at each end thereof, said threaded ends of said connecting link being adjustably mounted in said internally threaded spheres, said connecting link being provided with a constrained layer damping arrangement for dissipating vibrational energy.

2. The adjustable link of claim 1, wherein said connecting link includes at least a hollow section, a rod positioned in said hollow section, and a viscoelastic layer separating said hollow section of said connecting link and said rod, thereby forming said constrained layer damping arrangement.

3. The adjustable link of claim 1, wherein each of said socket support members includes a curved surface for providing a thin ring of contact with said sphere.

4. The adjustable link of claim 3, wherein each of said socket support members is of a gothic arch configuration.

5. The adjustable link of claim 1, wherein each of said adjustable retaining means comprises a clamping nut having an opening therethrough through which said connecting link extends, said opening including a curved surface in contact with said sphere.

6. The adjustable link of claim 1, wherein each of said socket support members includes a plurality of spaced apertures for attachment thereof to a point of use, and an opening having a plurality of different diameter sections, said opening including a curved surface interconnecting two of said plurality of different diameter sections, said curved surface forming a thin ring of contact with said sphere.

7. The adjustable link of claim 6, wherein an outer section of one of said plurality of different diameter sections is threaded.

8. The adjustable link of claim 7, wherein each of said adjustable retaining means comprises a clamping nut having a central opening and at least a partially threaded outer side surface, said central opening including a curved surface for contact with said sphere, said threaded outer side surface of said clamping nut being threaded into said threaded section of said socket support member.

9. The adjustable link of claim 1, wherein each of said spheres includes a threaded opening extending therethrough, whereby said threaded ends of said connecting link may be adjustably threaded through and extend from said threaded opening in said sphere.

10. An adjustable link for a kinematic mounting system, comprising:

a pair of internally thread spheres, a pair of socket support members for retaining said spheres, a pair of adjustable means for retaining said spheres in said socket support members, and a connecting link having threads at each end thereof, said threaded ends of said connecting link being adjustably mounted in said internally threaded spheres;

each of said spheres including flexural cuts for providing preloading of the sphere in the socket support member and preloading of the threads therein.

11. In a kinematic mounting device having a pair of support members and a linkage therebetween, the improvement comprising:

a pair of spheres adjustably secured in the support members, each of said spheres having a threaded opening therein, a link having threaded end sections, said threaded end sections being adjustably poisitioned in said threaded openings in said spheres; and adjustable clamping means for adjustably securing said spheres in said support members;

said link being provided with a constrained layer damping arrangement for dissipating vibrational energy.

12. The improvement of claim 11, wherein each of said spheres includes flexural cuts for providing preloading of the spheres and the threads of the threaded openings.

13. In the kinematic mounting device of claim 11, said support members each being provided with an opening defining a socket in which said spheres are retained, each of said opening including a curved surface to provide a thin ring of contact with said spheres.

14. In the kinematic mounting device of claim 13, said support members each defining a gothic arch shaped socket having a plurality of apertures for mounting said support members to a point of use.

15. The improvement of claim 11, wherein said link includes at least a hollow section, a rod positioned in said hollow section, and a viscoelastic separation layer, defining said constrained layer damping arrangement.

* * * * *